United States Patent
Wang et al.

(10) Patent No.: US 9,763,322 B2
(45) Date of Patent: Sep. 12, 2017

(54) FLEXIBLE SUBSTRATE REPAIR STRUCTURE, MANUFACTURING METHOD THEREOF, AND INSPECTION AND REPAIR METHOD OF FLEXIBLE SUBSTRATE

(71) Applicant: Industrial Technology Research Institute, Hsinchu (TW)

(72) Inventors: Chao-Jen Wang, Hsinchu (TW); Jia-Chong Ho, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/394,831

(22) Filed: Dec. 30, 2016

(65) Prior Publication Data

US 2017/0208682 A1    Jul. 20, 2017

Related U.S. Application Data

(60) Provisional application No. 62/280,681, filed on Jan. 19, 2016.

(30) Foreign Application Priority Data

Nov. 29, 2016   (TW) .............................. 105139250 A

(51) Int. Cl.
   *H05K 1/02*   (2006.01)
   *H05K 3/22*   (2006.01)
   (Continued)

(52) U.S. Cl.
   CPC ......... *H05K 1/0281* (2013.01); *H05K 1/0269* (2013.01); *H05K 3/22* (2013.01);
   (Continued)

(58) Field of Classification Search
   CPC ...... H05K 1/0281; H05K 1/0269; H05K 3/22; H05K 3/28
   See application file for complete search history.

(56) References Cited

U.S. PATENT DOCUMENTS 5,470,609 A   11/1995   Leach et al.
5,790,304 A    8/1998   Sanders et al.
(Continued)

FOREIGN PATENT DOCUMENTS

| CN | 101410947 | 4/2009 |
| TW | I331365 | 10/2010 |
| TW | I424497 | 1/2014 |

OTHER PUBLICATIONS

Longfei Hu et al., "Perhydropolysilazane derived silica coating protecting Kapton from atomic oxygen attack", Thin Solid Films 520, Nov. 30, 2011, 1063-1068.

*Primary Examiner* — Jeremy C Norris
(74) *Attorney, Agent, or Firm* — Jianq Chyun IP Office

(57) ABSTRACT

A flexible substrate repair structure, a manufacturing method thereof, and an inspection and repair method of a flexible substrate are provided. The flexible substrate repair structure includes a flexible substrate and at least one repair layer. The flexible substrate has a regular recess. The at least one repair layer is located on the flexible substrate and is completely filled in the regular recess. The material of the repair layer includes a polysilazane compound having the unit shown in formula (1) below,

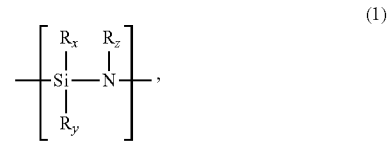

wherein $R_x$, $R_y$ and $R_z$ are respectively hydrogen, a $C_1$ to $C_{10}$ substituted alkyl group, an unsubstituted alkyl group, an alkenyl group, or an aromatic group.

20 Claims, 14 Drawing Sheets

(51) Int. Cl.
   *H05K 3/28*   (2006.01)
   *H05K 13/08*  (2006.01)

(52) U.S. Cl.
   CPC ............... *H05K 3/28* (2013.01); *H05K 13/08* (2013.01); *H05K 2201/0104* (2013.01); *H05K 2203/16* (2013.01)

(56) References Cited

U.S. PATENT DOCUMENTS

| | | |
|---|---|---|
| 6,087,191 A | 7/2000 | Boggs |
| 2009/0095922 A1 | 4/2009 | Lee et al. |

US 9,763,322 B2

FLEXIBLE SUBSTRATE REPAIR STRUCTURE, MANUFACTURING METHOD THEREOF, AND INSPECTION AND REPAIR METHOD OF FLEXIBLE SUBSTRATE

CROSS-REFERENCE TO RELATED APPLICATION

This application claims the priority benefits of U.S. provisional application Ser. No. 62/280,681, filed on Jan. 19, 2016 and Taiwan application serial no. 105139250, filed on Nov. 29, 2016. The entirety of each of the above-mentioned patent applications is hereby incorporated by reference herein and made a part of this specification.

TECHNICAL FIELD

The disclosure relates to a flexible substrate repair structure, a manufacturing method thereof, and an inspection and repair method of a flexible substrate.

BACKGROUND

During the manufacture, post-treatment, and delivery of a flexible substrate, defects may occur on the surface of the flexible substrate or inside the flexible substrate. After inspection, a flexible substrate having these defects may be considered as waste, such that manufacturing cost is increased. Otherwise, further performing a subsequent process on the flexible substrate having these defects results in a reduced process yield. Thus, techniques of repairing defects of a flexible substrate are an area of focus in the art.

SUMMARY

The flexible substrate repair structure according to some embodiments of the disclosure includes a flexible substrate and at least one repair layer. The flexible substrate has a regular recess. The at least one repair layer is located on the flexible substrate and is completely filled in the regular recess, wherein the material of the at least one repair layer includes a polysilazane compound having a unit shown in formula (1) below,

(1)

wherein $R_x$, $R_y$ and $R_z$ are respectively hydrogen, a substituted $C_1$ to $C_{10}$ alkyl group, an unsubstituted alkyl group, an alkenyl group, or an aromatic group.

The manufacturing method of a flexible substrate repair structure according to some embodiments of the disclosure includes the following steps. A repair solution is coated on a flexible substrate. The capillary index of the repair solution is less than $10^{-5}$. A solvent in the repair solution is removed to form at least one repair material layer. An optical adjustment step is performed to change the refractive index of the at least one repair material layer to form at least one repair layer.

The inspection and repair method of a flexible substrate according to some embodiments of the disclosure includes the following steps. Inspection is performed on a flexible substrate to determine whether the flexible substrate has a defect. The inspected defect is categorized according to the type or the location of the defect if the inspection result shows a defect. Next, the manufacturing method of a flexible substrate repair structure is performed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
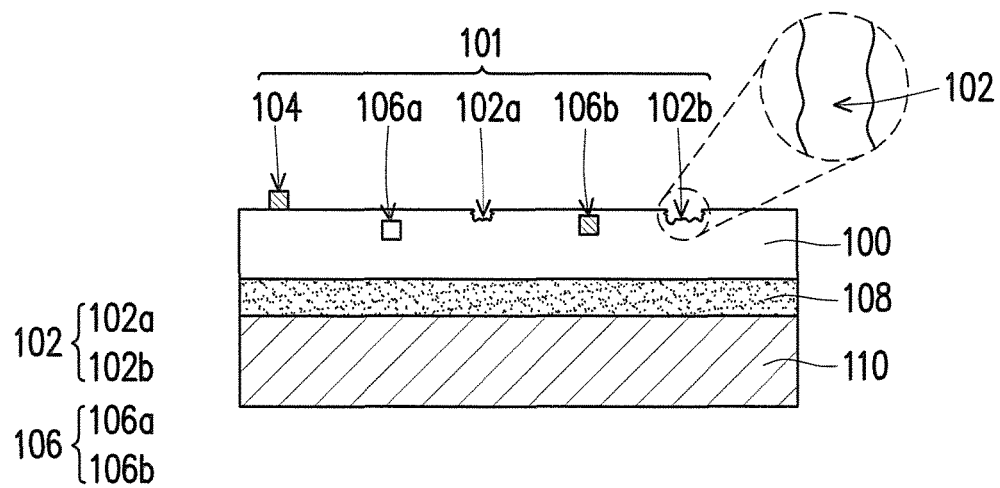
FIG. 1A to FIG. 1F are schematic cross-sectional views of a manufacturing process of a flexible substrate repair structure according to some embodiments of the disclosure.

Reference will now be made in detail to the present embodiments of the disclosure, instances of which are illustrated in the accompanying drawings. Wherever possible, the same reference numbers are used in the drawings and the description to refer to the same or like parts.

Figure 3A:
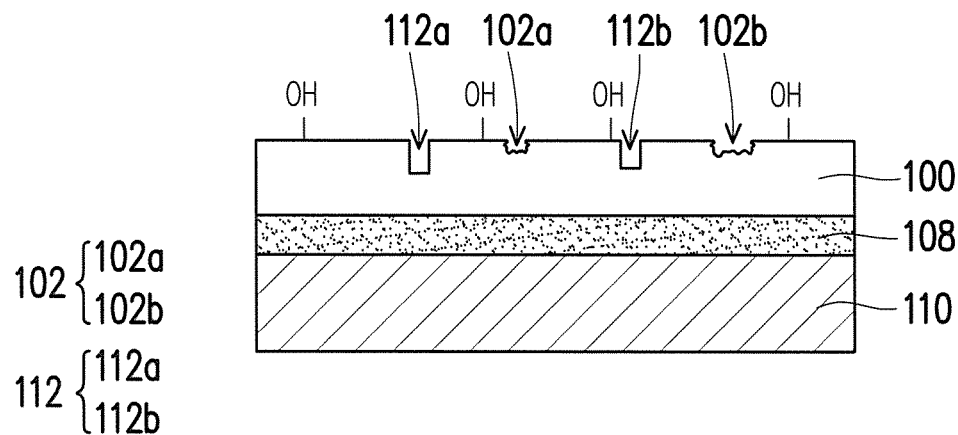
FIG. 3A to FIG. 3B are enlarged schematic views of the process of forming a repair material layer on the surface of the flexible substrate of FIG. 1B after a hydrophilic treatment.
Figure 3B:
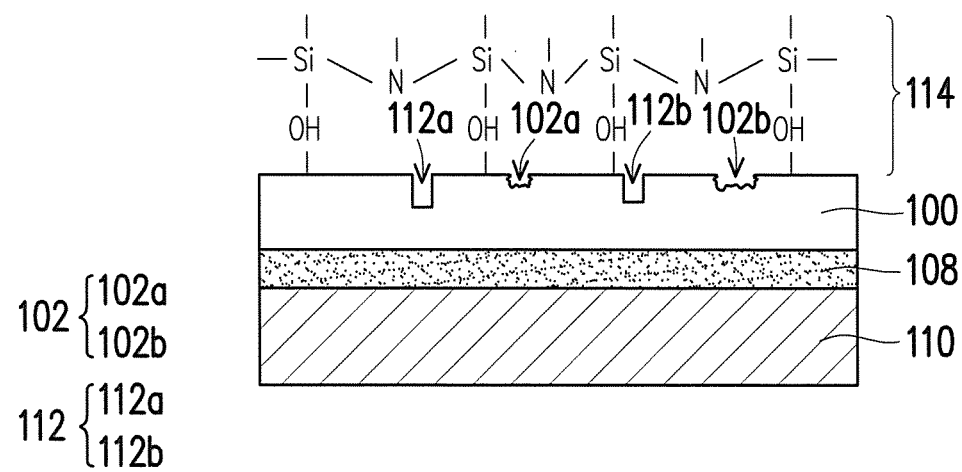
Figure 4A:
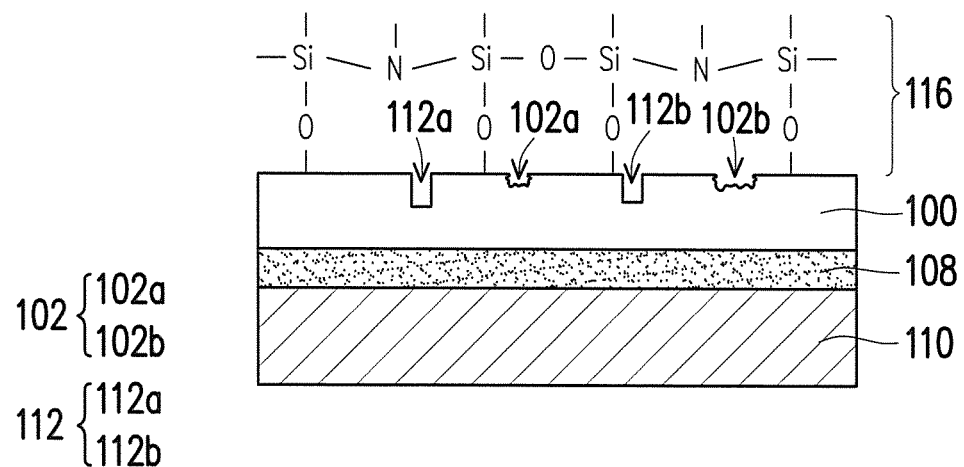
FIG. 4A and FIG. 4B are enlarged schematic cross-sectional views of the process of a post-treatment of the repair layer of FIG. 1C.
Figure 4B:
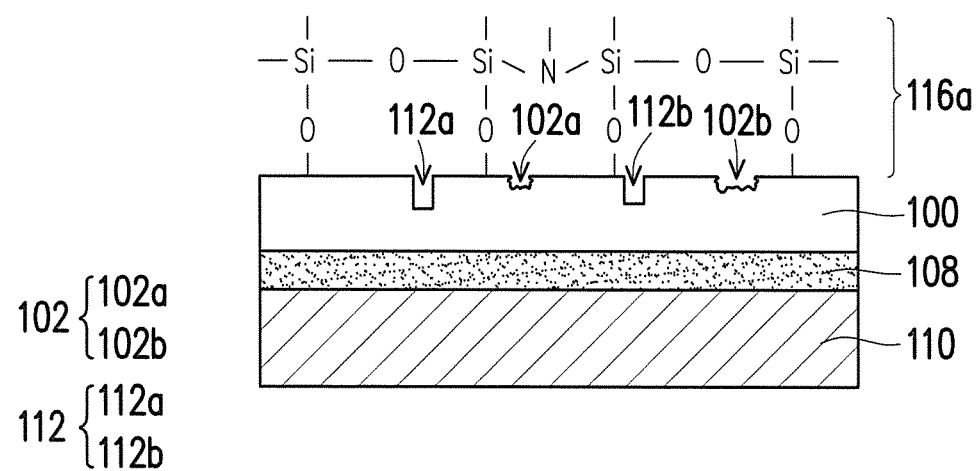

FIG. 1A to FIG. 1F are schematic cross-sectional views of a manufacturing process of a flexible substrate repair structure according to some embodiments of the disclosure. FIG. 2 is a flow chart of an inspection and repair method of a flexible substrate according to some embodiments of the disclosure. FIG. 3A to FIG. 3B are enlarged schematic views of a process of forming a repair material layer on the surface of the flexible substrate of FIG. 1B after a hydrophilic treatment. FIG. 4A and FIG. 4B are enlarged schematic cross-sectional views of a process of a post-treatment of the repair layer of FIG. 1C.

Figure 2:
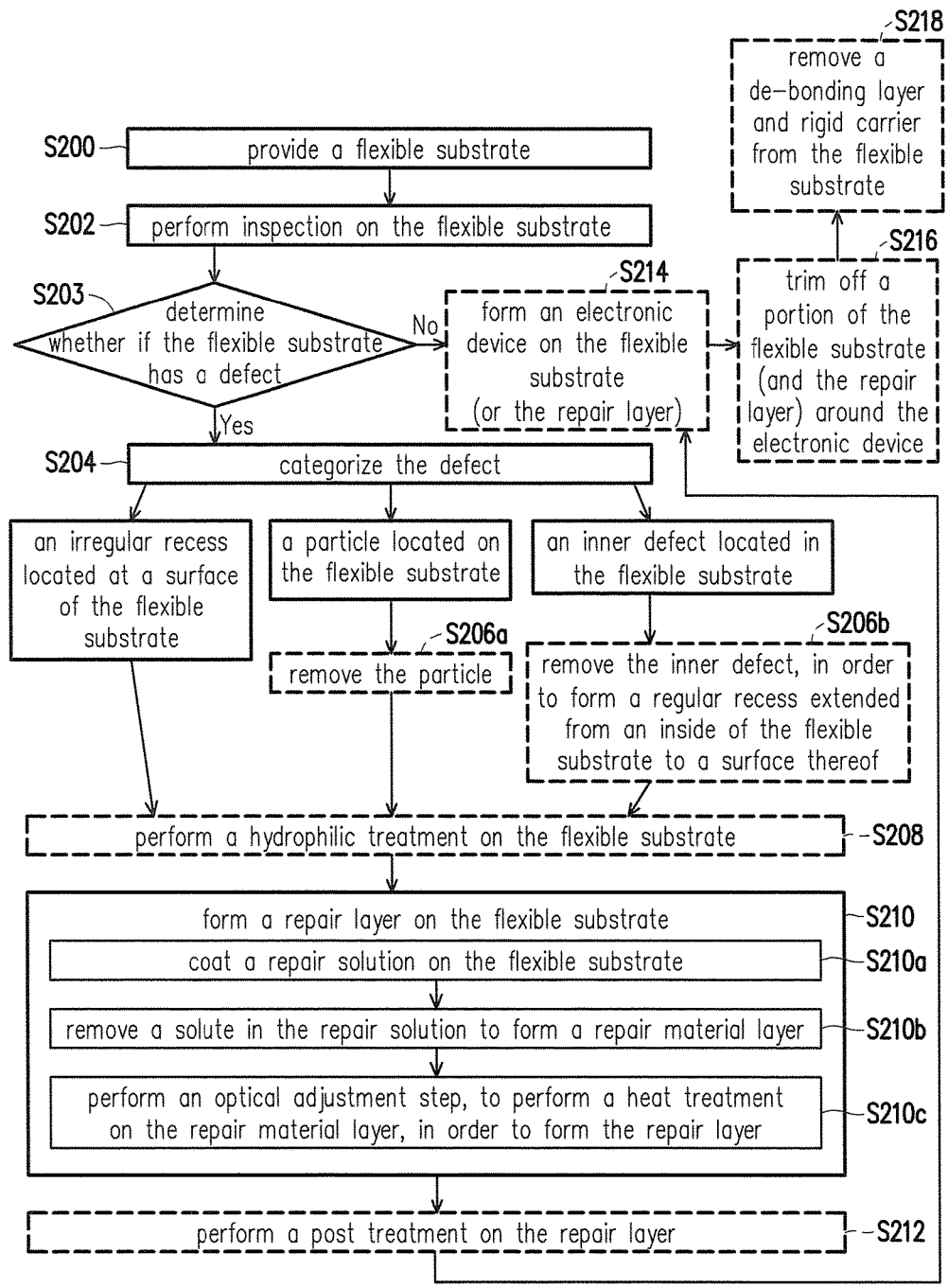
FIG. 2 is a flow chart of an inspection and repair method of a flexible substrate according to some embodiments of the disclosure.

Referring to both FIG. 1A and FIG. 2, an inspection and repair method of a flexible substrate of the present embodiment includes the following steps. Step S200 is performed to provide a flexible substrate 100. The material of the flexible substrate 100 is, for instance, polyimide (PI), polymethylmethacrylate (PMMA), polycarbonate (PC), polyethersulfone (PES), polyamide (PA), polynorbornene (PNB), polyethylene terephthalate (PET), polyether ether ketone (PEEK), polyethylene naphthalate (PEN), polyethyleneimine (PEI), or a combination thereof.

In some embodiments, the flexible substrate 100 is formed on a rigid carrier 110, and a de-bonding layer 108 is formed on the rigid carrier 110. In addition, a suitable material of the de-bonding layer 108 can be selected according to the material of the flexible substrate 100. The material of the de-bonding layer 108 includes a metal material, a ceramic material, or an organic material. The organic material is, for instance, an organic compound containing fluorine, a polymer containing chlorine, an organic compound containing silicon, or a combination thereof. In some embodiments, the organic compound containing fluorine can be, for instance, polytetrafluoroethene (PTEF), polyvinylidene difluoride (PVDF), fluorinated ethylene propylene (FEP) copolymer, or a combination thereof. In some embodiments, the polymer containing chlorine can be, for instance, polyvinyl chloride (PVC). In some embodiments, the organic compound containing silicon is, for instance, polysiloxane. However, the disclosure is not limited to the material of the de-bonding layer 108, and other materials having low surface energy that do not readily react with adjacent materials are all suitable.

A defect at the flexible substrate 100 may be formed during the manufacture, post-treatment, or delivery of the flexible substrate 100. If an electronic device is formed on the flexible substrate 100 having the defect, then the electronic device may have an optical defect that visible to the user. Accordingly, step S202 is performed next to inspect the flexible substrate 100 to determine whether the flexible substrate 100 has a defect. In some embodiments, the inspection method may be optical inspection, such as automated optical inspection (AOI) with a resolution of, for instance, 1 µm. In other words, a defect larger than 1 µm can be detected, but a defect smaller than 1 µm cannot be detected. However, the disclosure is not limited thereto.

Step S203 is performed to determine whether the flexible substrate 100 has a defect. If the flexible substrate 100 is determined to not have a defect or to have a defect smaller than the measurement limit, then step S214 may be directly performed to form an electronic device on the flexible substrate 100. Next, step S216 may be performed to trim off a portion of the flexible substrate 100 around the electronic device. Then, step S218 may be performed to remove the de-bonding layer 108 and the rigid carrier 110 from the flexible substrate 100. In some embodiments, the de-bonding layer 108 may be separated from the flexible substrate 100 by a manner of mechanical force. In other embodiments, the de-bonding layer 108 may also be separated from the flexible substrate 100 through an air knife, a thread, or other manners.

If the flexible substrate 100 is determined to have a defect 101, then a manufacturing method of a flexible substrate repair structure is performed. Step S204 is performed to categorize the defect 101. The type of the defect 101 may include an irregular recesses 102, a foreign matter 104, or an inner defect 106, but the disclosure is not limited thereto. Irregular recesses 102 are located on the surface of the flexible substrate 100, and are, for instance, recesses with a rough contour. The shape, cross-sectional area, and/or depth of the irregular recesses 102 are different from one another. The irregular recesses 102 may include an irregular recess 102a and an irregular recess 102b. For instance, the irregular recess 102b is a scratch or a micro-crack, and an enlarged schematic top view thereof is shown as the area enclosed by a dash line in FIG. 1A. The irregular recess 102a is, for instance, a pinhole or a cavity. The foreign matter 104 is located on the flexible substrate 100. The inner defect 106 is located in the flexible substrate 100, and the inner defect 106 may include an inner defect 106a and an inner defect 106b. The inner defect 106a is, for instance, a closed void, and the inner defect 106b is, for instance, an impurity.

Figure 1B:
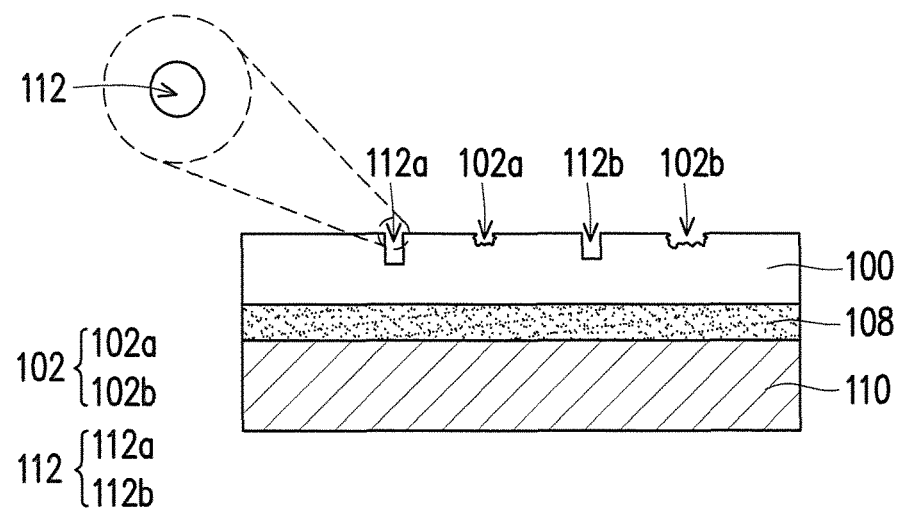

Referring to both FIG. 1B and FIG. 2, if the flexible substrate has the foreign matter 104, then step S206a may be optionally performed to remove the foreign matter 104. If the flexible substrate 100 has the inner defect 106, then step S206b may be performed to remove the inner defect 106 to form regular recesses 112 extended from the inside the flexible substrate 100 to the surface thereof. The regular recesses 112 include a regular recesses 112a and a regular recesses 112b respectively corresponding to the inner defect 106a and the inner defect 106b. A physical method may be used as the method of removing the foreign matter 104 and the inner defect 106. In some embodiments, the method of removing the foreign matter 104 includes performing pulse laser etching on the foreign matter 104, or polishing the surface of the flexible substrate 100. In some embodiments, the method of removing the inner defect 106 includes, for instance, performing pulse laser etching on the inner defect 106 to form the regular recesses 112. The regular recesses 112 recesses for which a projection on the flexible substrate 100 has a smooth contour. The shape and/or the cross-sectional area of the regular recesses 112 are the same as or different from one another. The shape of a projection of the regular recesses 112 on the flexible substrate 100 includes a circular shape, an oval shape, a rectangular shape or a polygonal shape. For instance, the shape of the projection of the regular recesses 112 on the flexible substrate is circular, and a schematic top view thereof is shown as an area enclosed by a dash line in FIG. 1B.

In some embodiments, the cross-sectional area of the regular recesses 112 may range between 100 µm$^2$ and 900 µm$^2$, or be larger than 900 µm$^2$. In some exemplary embodiments, when the diameter of the inner defect 106 is ranged between 1 µm and 10 µm, the cross-sectional area of the regular recesses 112 subsequently formed may be 100 µm$^2$. In some other exemplary embodiments, the diameter of the inner defect 106 is ranged between 10 µm and 20 µm, the cross-sectional area of the regular recesses 112 subsequently formed may be 400 µm$^2$. In some other exemplary embodiments, the diameter of the inner defect 106 is ranged between 20 µm and 30 µm, and the cross-sectional area of the regular recesses 112 subsequently formed may be 900 µm$^2$.

In some other embodiments, if the thickness of the foreign matter 104 of the flexible substrate 100 is less than 1 µm, then step S206a may be omitted, such that a layer subsequently formed covers the foreign matter 104. In addition, in other embodiments, if the depth of the inner defect 106 in the flexible substrate 100 is larger than half of the thickness of the flexible substrate 100 (i.e., the inner defect 106 is relatively close to the de-bonding layer 108), then step S206b may be omitted. Thus, the problem of insufficient mechanical strength of the flexible, substrate caused by an excessive depth of a regular recess subsequently formed may be avoided.

Referring to both FIG. 2 and FIG. 3A, step S208 is optionally performed to perform a hydrophilic treatment on the flexible substrate 100 to form hydrophilic functional groups on the surface of the flexible substrate 100. For instance, a method of performing the hydrophilic treatment may be performing a degrease treatment on the surface of the flexible substrate 100 using alcohol or ketone (e.g., ethanol or acetone). Next, an activation treatment is performed on the surface of the flexible substrate 100 using a base solution. For instance, the activation treatment is performed by a sodium hydroxide (NaOH) solution with a molarity of 1M within 30 minutes. Next, the surface of the flexible substrate 100 is functionalized by an acid solution to form hydrophilic functional groups, such as hydroxyl groups (OH functional groups), on the surface of the flexible substrate 100. The acid solution applied during the functionalization treatment is, for instance, an acetic acid solution with a molarity of 0.1 M, and the treatment time of the functionalization treatment is, for stance, within 30 minutes. Eventually, the flexible substrate 100 is rinsed with pure water, and then the flexible substrate 100 is air-dried.

Figure 1C:
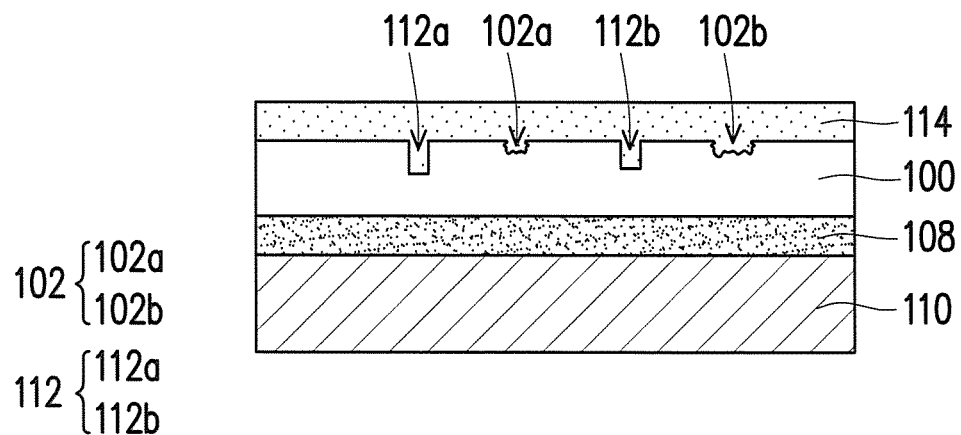
Figure 1D:
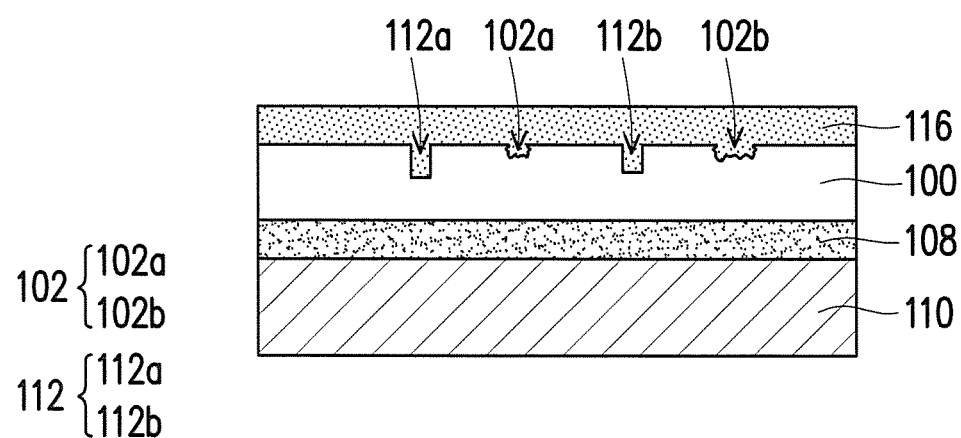

Referring to both FIG. 1C, FIG. 1D and FIG. 2, step S210 is performed next to form a repair layer 116 on the flexible substrate 100. The step of forming the repair layer 116 includes the following sub-steps. First, sub-step S201a is performed to coat a repair solution on the flexible substrate 100. In the present embodiment, the flexible substrate 100 has the irregular recesses 102 and the regular recesses 112, and the repair solution is completely filled in the irregular recesses 102 and the regular recesses 112. A solute of the repair solution includes a silazane compound having a unit shown in formula (1) below:

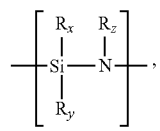

(1)

$R_x$, $R_y$ and $R_z$ are respectively hydrogen, a substituted $C_1$ to $C_{10}$ alkyl group, an unsubstituted alkyl group, an alkenyl group, or an aromatic group. In some embodiments of the disclosure, the silazane compound may be a monomer, a compound, an oligomer, or a polymer. In other words, in some embodiments, the silazane compound has a silazane compound having a unit shown in formula (2) below,

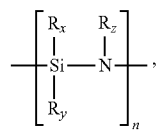

(2)

$R_x$, $R_y$ and $R_z$ are respectively hydrogen, a substituted $C_1$ to $C_{10}$ alkyl group, an unsubstituted alkyl group, an alkenyl group, or an aromatic group, and n is a natural number ranged from 1 to 10000. Additionally, in some embodiments of the disclosure, the molecular mass of the silazane compound may range from 47 to $1 \times 10^6$. The solvent of the repair solution may be an aromatic compound such as ethylbenzene or dimethylbenzene. In some embodiments, the capillary index of the repair solution is less than $10^{-5}$ so that a capillary force is dominant when the repair solution flows on the surface having the irregular recesses 102 and the regular recesses 112. Thus, the repair solution may be completely filled in the irregular recesses 102 and the regular recesses 112. If the capillary index of the repair solution is greater than $10^{-5}$, then a viscous force is dominant when the repair solution flows. Therefore, the repair solution may not be completely filled in the irregular recesses 102 and the regular recesses 112 such that a void may be produced. This void may result in a phenomenon of stress concentration, which may lead to the problem of cracking or breaking of a layer subsequently formed on the flexible substrate 100 in a subsequent process. Moreover, the method of adjusting the capillary index of the repair solution includes, for instance, adjusting the solid content of the repair solution. In some embodiments of the disclosure, when the solid content of the repair solution is, for instance, 3%, the capillary index of the repair solution may be less than $10^{-5}$. In addition, in other embodiments, if the foreign matter 104 is not removed in sub-step S206a, then the repair solution further covers the foreign matter 104.

Next, sub-step S210b is performed to remove the solvent in the repair solution to form a repair material layer 114. The method of removing the solvent includes, for instance, performing a pre-bake on the repair solution. In some embodiments, the temperature of the pre-bake ranges from 120° C. to 150° C. The thickness of the resulting repair material layer 114 from a flat surface of the flexible substrate 100 is less than 1 µm, such as 250 nm. The material of the repair material layer 114 has the silazane compound having the unit shown as in formula (1) below:

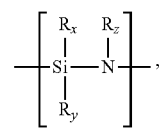

(1)

$R_x$, $R_y$ and $R_z$ are respectively hydrogen, a substituted $C_1$ to $C_{10}$ alkyl group, an unsubstituted alkyl group, an alkenyl group, or an aromatic group. In some embodiments of the disclosure, the silazane compound may be a monomer, a compound, an oligomer or a polymer. In other words, in some embodiments, the silazane compound has a silazane compound having a unit shown in formula (2) below,

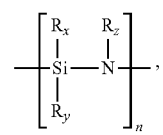

(2)

$R_x$, $R_y$ and $R_z$ are respectively hydrogen, a substituted $C_1$ to $C_{10}$ alkyl group, an unsubstituted alkyl group, an alkenyl group, or an aromatic group, and n is a natural number ranged from 1 to 10000. Additionally, in some embodiments of the disclosure, the molecular mass of the silazane compound may be ranged from 47 to $1 \times 10^6$. The adhesion between the flexible substrate 100 and the material layer formed by the silazane compound is sufficient, and is higher than the adhesion between the flexible substrate 100 and a conventional repair material layer (the material thereof is the same as the material of the flexible substrate 100), so that the problem of delamination between the flexible substrate and the repair material layer may be avoided. Moreover, the silazane compound can further block moisture and oxygen in the atmosphere from penetrating the flexible substrate 100 and enter an electronic device subsequently formed on the flexible substrate 100. Therefore, degradation to the electronic device may be avoided, which is caused by reaction with moisture and oxygen.

Referring to FIG. 3B, the hydrophilic functional groups (e.g., OH groups) formed at the surface of the flexible substrate 100 in the step S208 may form hydrogen bonds with nitrogen atoms in the repair material layer 114. In the embodiment a the repair material layer 114 is the silazane compound, the hydrophilic functional groups (e.g., OH groups) may form bonds (e.g., Si—OH bonds) with silicon atoms in the silazane compound. Thus, the adhesion force between the flexible substrate 100 and the repair material layer 114 may be further enhanced.

Afterward, sub-step S210c is performed to perform an optical adjustment step to form a repair layer 116. The optical adjustment step may be referred to as a curing reaction. In the present embodiment, the optical adjustment step may be performing a heat treatment on the repair material layer 114. For instance, the temperature of the heat treatment is ranged from 200° C. to 400° C. In some embodiments, the repair material layer 114 includes the silazane compound. The polymerization reaction of the silazane compound may be produced while performing the heat treatment. The polymerization reaction is such as a cross-linking polymerization reaction, and reduces a nitrogen atom percentage in the repair material layer 114. In other words, when performing the heat treatment, the silazane compound in the repair material layer 114 generates the cross-linking polymerization reaction, and performs a hydrolysis reaction with moisture in air and in the flexible substrate 100. Due to the hydrolysis reaction, ammonia is generated and dissipated to the atmosphere, and Si—N bonds in the silazane compound are partly transformed into Si—O bonds, to form the repair layer 116. Accordingly, after performing the heat treatment, the formed repair layer 116 includes a polysilazane compound having the repeat unit shown in formula (1) below:

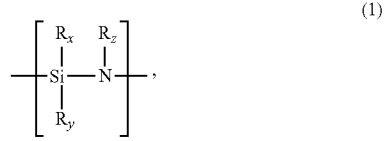

(1)

$R_x$, $R_y$ and $R_z$ are respectively hydrogen, a substituted $C_1$ to $C_{10}$ alkyl group, an unsubstituted alkyl group, an alkenyl group, or an aromatic group. The number-average molecular weight of the polysilazane compound is greater than $1 \times 10^6$. In some embodiments, the polysilazane compound is a macromolecule. In addition, a nitrogen atom percentage in the repair layer 116 is less than the nitrogen atom percentage in the repair material layer 114, and the refractive index of the repair layer 116 is less than the refractive index of the repair material layer 114 as well. Moreover, the higher the temperature of the heat treatment, the more Si—N bonds in the silazane compound are transformed into Si—O bonds, thus the nitrogen atom percentage in the formed repair layer 116 is lower, and the refractive index of the repair layer 116 is lower as well. In the present embodiment, a heating time of the heat treatment is 2 minutes, the refractive index of the repair layer 116 is 1.592 when a heating temperature is 90° C.; the refractive index of the repair layer 116 is 1.572 when a heating temperature is 120° C.; the refractive index of the repair layer 116 is 1.545 when a heating temperature is 150° C.; the refractive index of the repair layer 116 is 1.548 when a heating temperature is 180° C. Thereby, the nitrogen atom percentage and the refractive index of the repair layer 116 may be controlled by adjusting the temperature of the heat treatment. By performing the heat treatment, an overall effective refractive index of the flexible substrate 100 and the repair layer 116 may match the refractive index of the flexible substrate 100. In some embodiments, the refractive index of the repair layer 116 is less than or approximated to the refractive index of the flexible substrate 100, a difference between the overall effective refractive index of the flexible substrate 100 and the repair layer 116 and the refractive index of the flexible substrate 100 is less than 0.1. Therefore, a color difference between the repair layer 116 and the flexible substrate 100 maybe effectively reduced.

Referring to both FIG. 2, FIG. 4A and FIG. 4B, after the repair layer 116 is formed, step S212 may be optionally performed to perform a post-treatment on the repair layer 116 to form a repair layer 116a. In some embodiments, the method of performing the post-treatment is performing the heat treatment again. For instance, the temperature of the heat treatment is ranged from 200° C. to 400° C. The polysilazane compound of the repair layer 116 may further perform a hydrolysis reaction with moisture in the air and in the flexible substrate 100 by the heat treatment. Thus, the nitrogen atom percentage and the refractive index of the repair layer 116a may be further lowered. In other words, the nitrogen atom percentage in the repair layer 116a is less than the nitrogen atom percentage in the repair layer 116. Additionally, the refractive index of the repair layer 116a may be less than the refractive index of the repair layer 116 as well. Furthermore, similarly to the heat treatment of sub-step S210c, one of ordinary skill in the art may control the refractive index of the repair layer 116a by adjusting the temperature of the heat treatment. In addition, the surface of the repair layer 116a may be planarized by performing the heat treatment again.

Figure 1E:
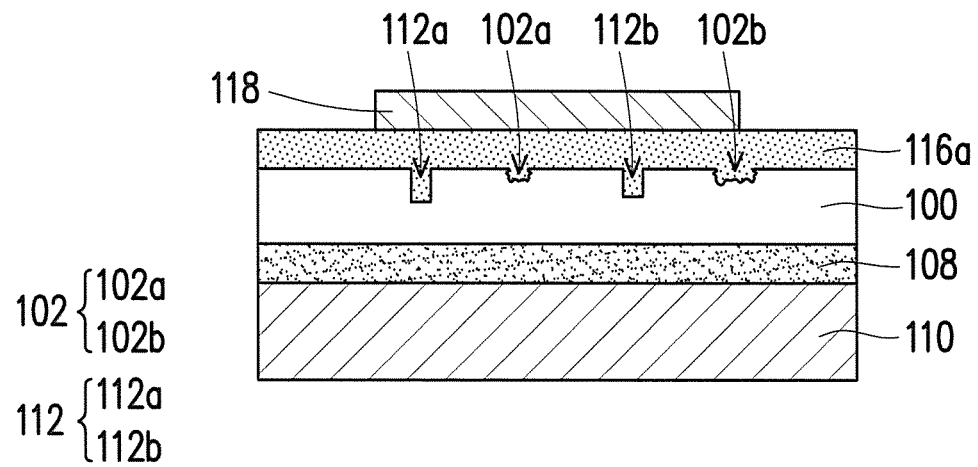
Figure 1F:
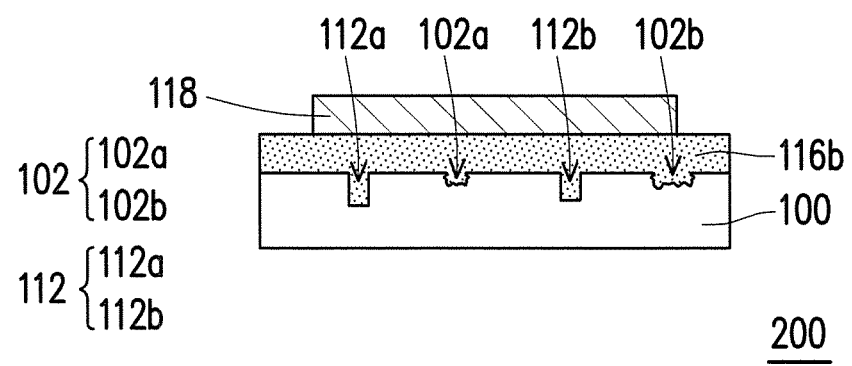

At this point, the manufacturing method of the flexible substrate repair structure is completed. Referring to FIG. 1E, FIG. 1F and FIG. 2, a subsequent process may include performing step S214 to form the electronic device 118 on the repair layer 116a. For instance, the electronic device 118 is an organic light-emitting device, a touch device, or other optical electronic devices. A suitable type of the electronic device may be selected by one of ordinary skill in the art as needed, and the disclosure is not limited thereto. Thereafter, step S216 is performed to perform trimming to trim off a portion of the flexible substrate 100 and the repair layer 116a around the electronic device 118. Eventually, step S218 may be performed to remove the de-bonding layer 108 and the rigid carrier 110 from the flexible substrate 100, in order to form an electronic apparatus 200. The electronic apparatus 200 includes the flexible substrate 100, the repair layer 116b, and the electronic device 118.

Referring to FIG. 1E or FIG. 1D, structurally, the flexible substrate repair structure of the present embodiment includes the flexible substrate 100 and the repair layer 116a (or the repair layer 116). The flexible substrate 100 has the regular recesses 112, for which a projection on the flexible substrate 100 has a smooth contour. The shape of the projection of the regular recesses 112 on the flexible substrate 100 includes a circular shape, an oval shape, a rectangular shape or a polygonal shape. For instance, the cross-sectional area of the regular recesses 112 may be between 100 μm² and 900 μm², or larger than 900 μm². The flexible substrate 100 may also include the irregular recesses 102 with a rough contour for which the shape, cross-sectional area, and/or depth are different from one another. The repair layer 116a (or the repair layer 116) is located on the flexible substrate 100, and is completely filled in the regular recesses 112, and may further be completely filled in the irregular recesses 102. In other embodiments, the defect 101 may further include a foreign matter (not shown) located on the flexible substrate 100, and the repair layer 116a (or the repair layer 116) may cover the foreign matter.

The de-bonding layer 108 may be disposed between the flexible substrate 100 and the rigid carrier 110. The material of the repair layer 116a (or the repair layer 116) is the polysilazane compound having the unit shown in formula (1), wherein $R_x$, $R_y$ and $R_z$ are respectively hydrogen, a substituted $C_1$ to $C_{10}$ alkyl group, an unsubstituted alkyl group, an alkenyl group, or an aromatic group. The number-average molecular weight of the polysilazane compound is greater than $1 \times 10^6$. In some embodiments, the polysilazane compound is a macromolecule.

Figure 5:
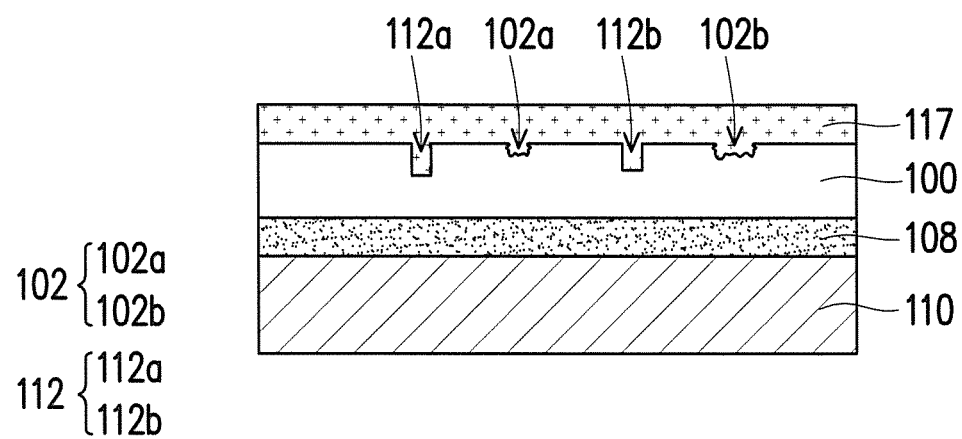
FIG. 5 is a schematic cross-sectional view of a flexible substrate repair structure according to some other embodiments of the disclosure.
Figure 6:
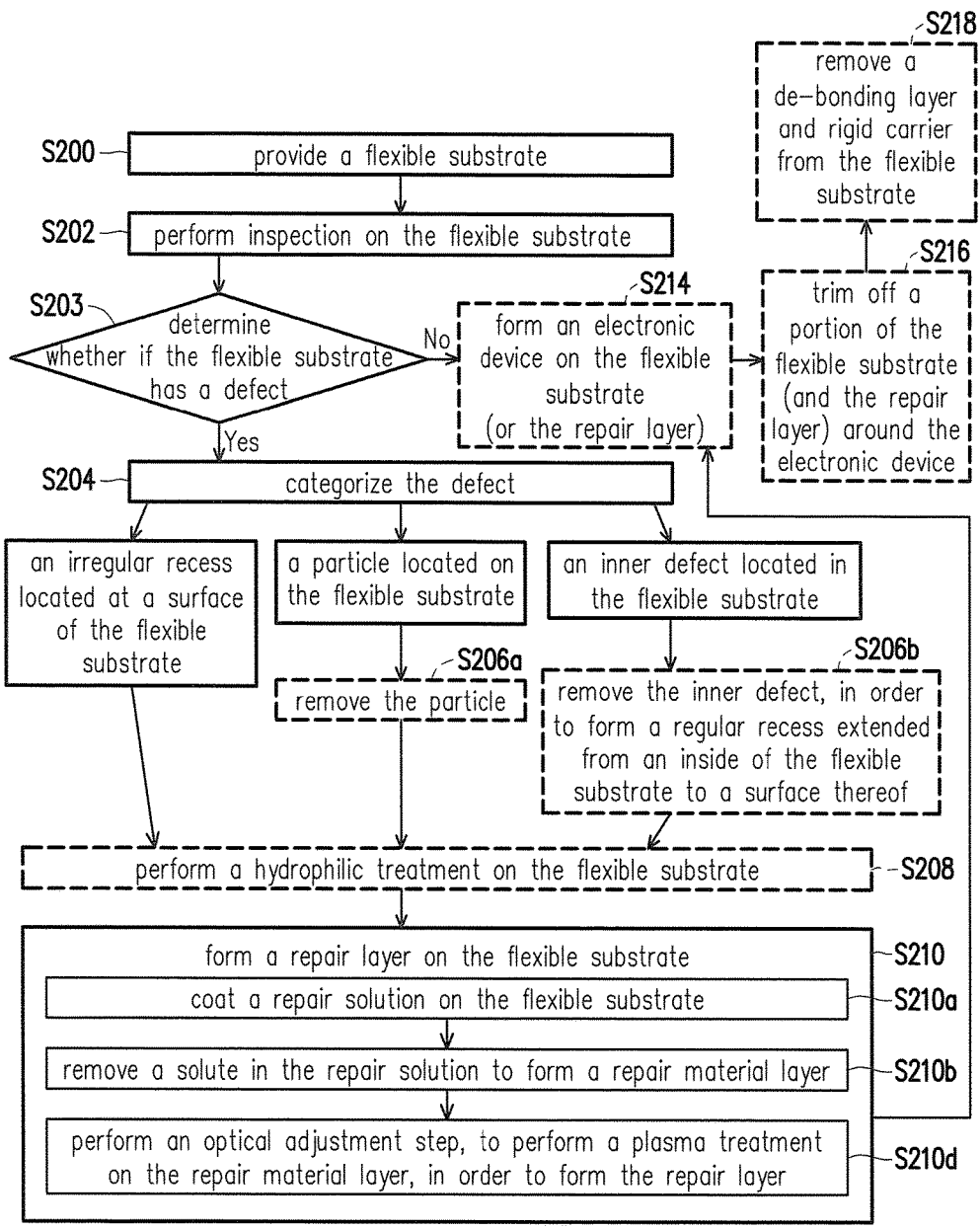
FIG. 6 is a flow chart of an inspection and repair method of a flexible substrate repair structure according to some other embodiments of the disclosure.
Figure 7A:
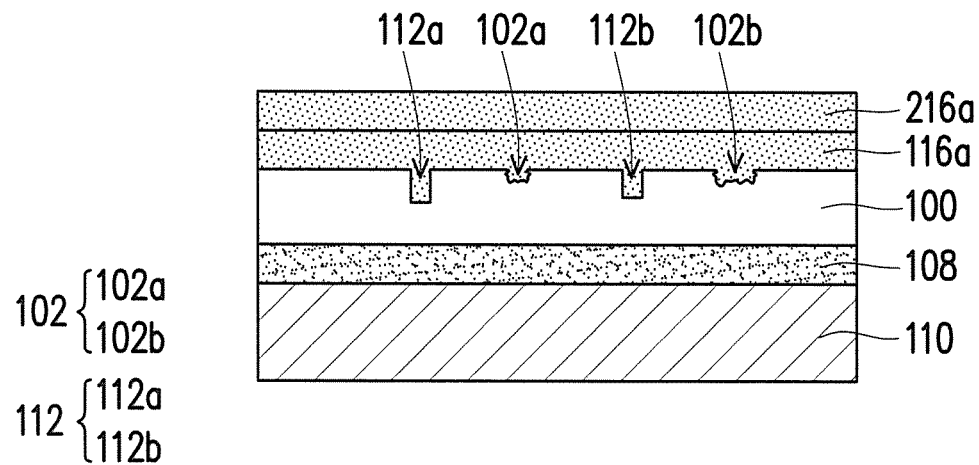
FIG. 7A to FIG. 7L are schematic cross-sectional views of a flexible substrate repair structure according to other embodiments of the disclosure.
Figure 7B:
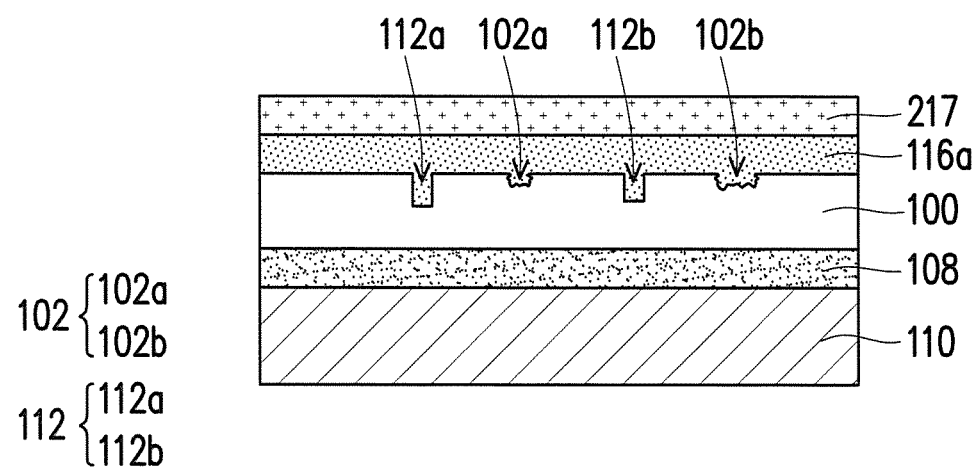
Figure 7C:
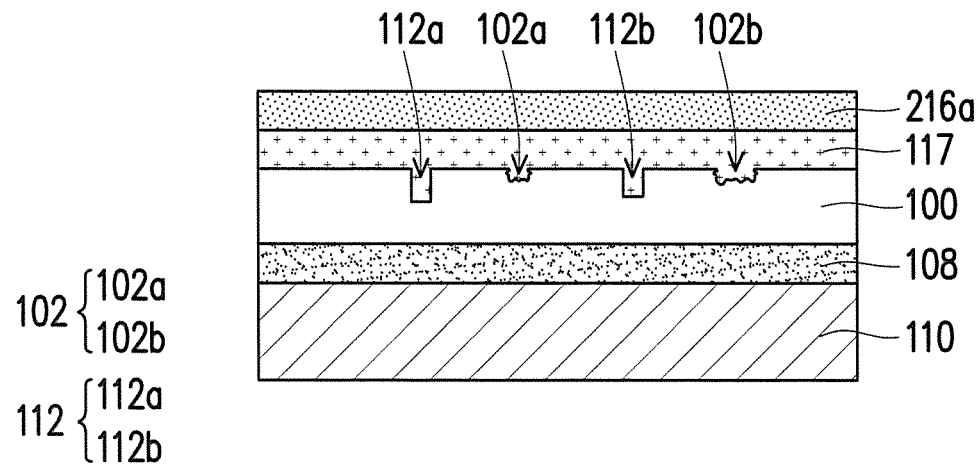
Figure 7D:
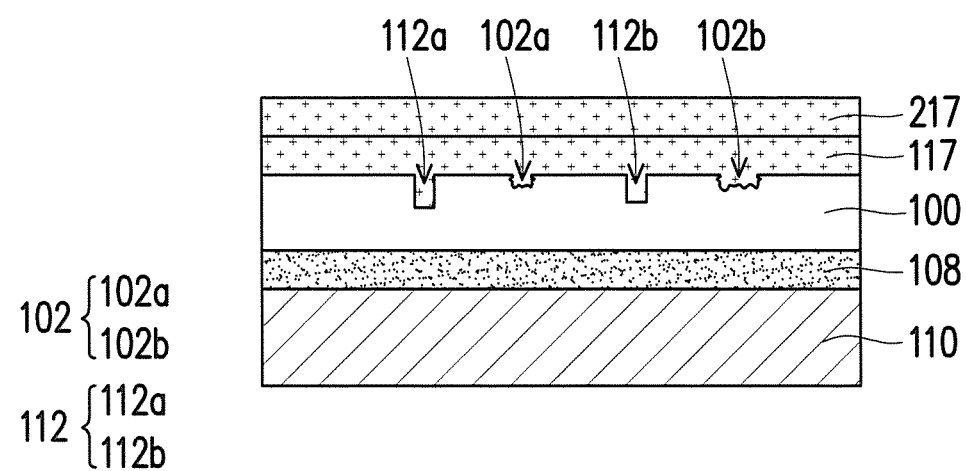
Figure 7E:
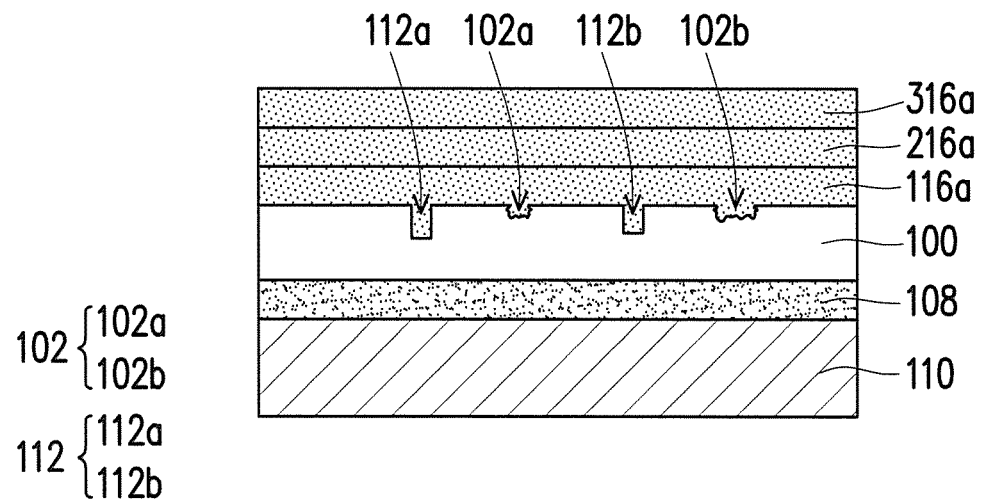
Figure 7F:
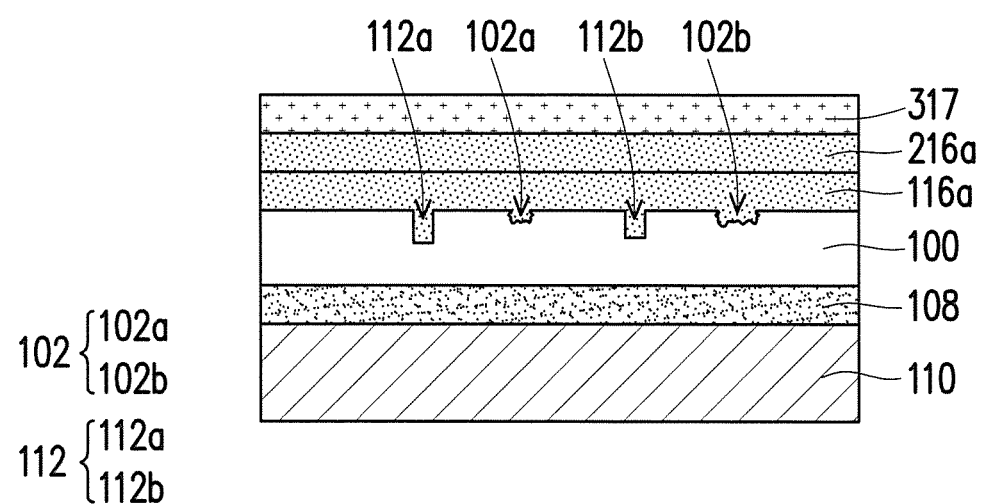
Figure 7G:
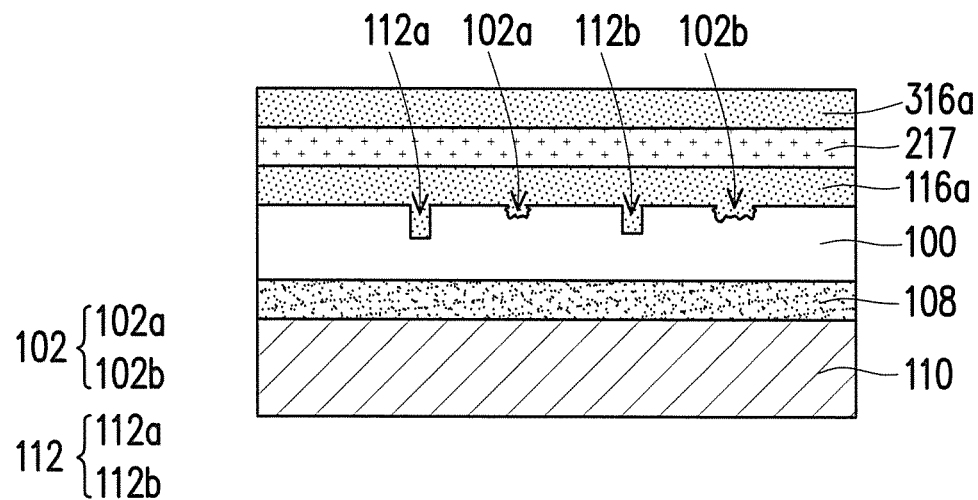
Figure 7H:
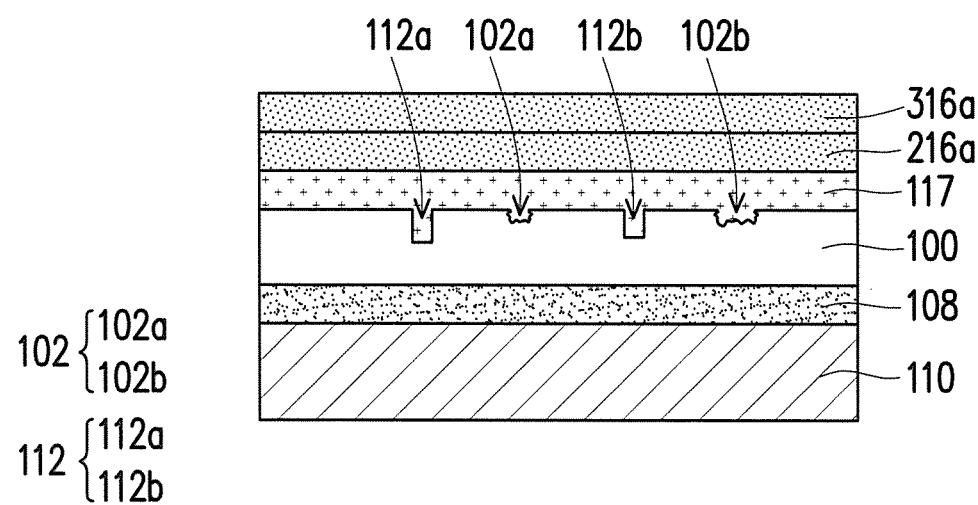
Figure 7I:
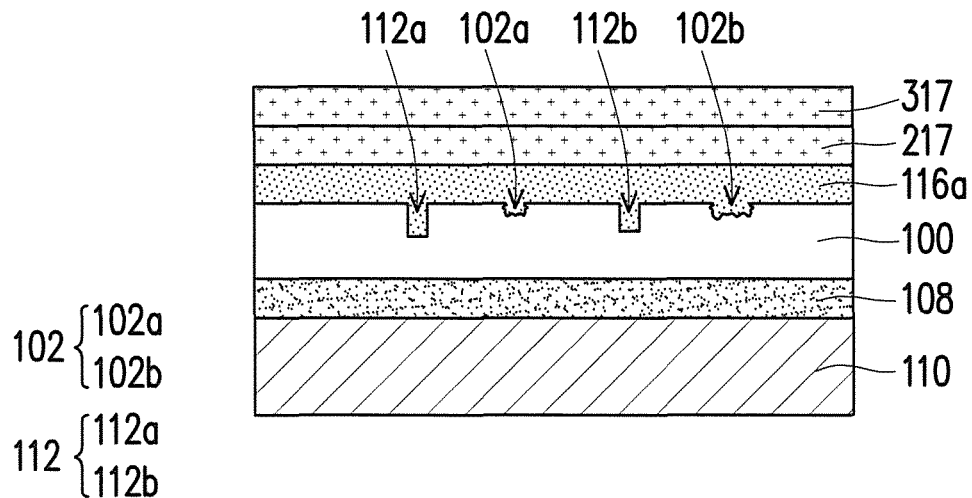
Figure 7J:
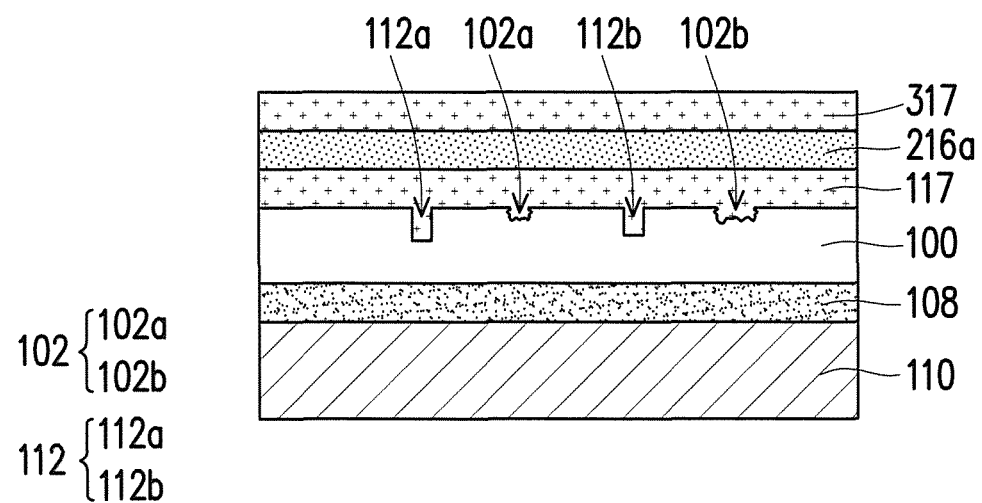
Figure 7K:
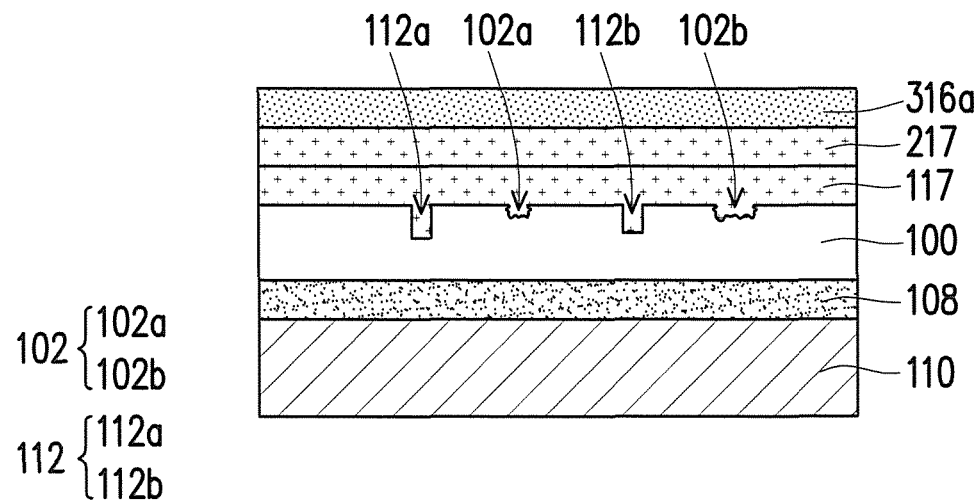
Figure 7L:
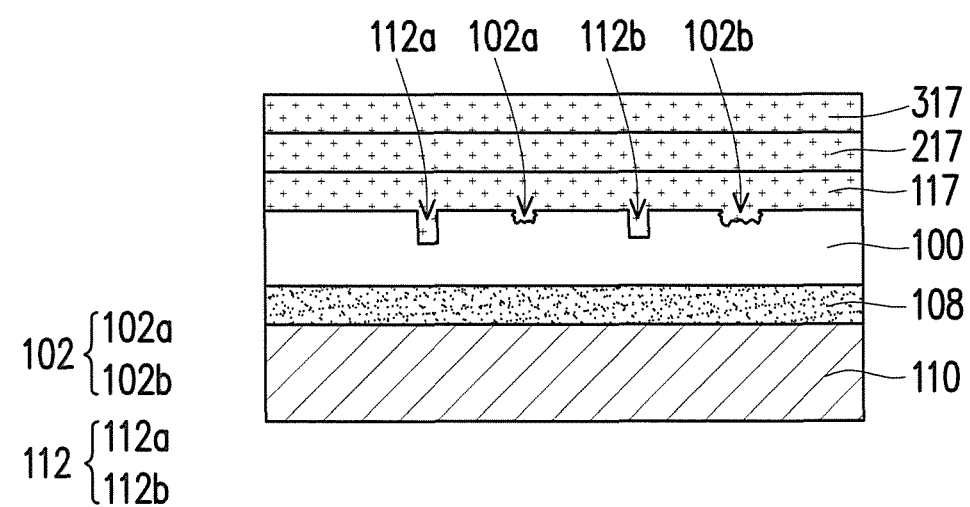

FIG. 5 is a schematic cross-sectional view of a flexible substrate repair structure according to another embodiment of the disclosure. FIG. 6 is a flow chart of an inspection and repair method of a flexible substrate repair structure according to another embodiment of the disclosure.

Referring to FIG. 5 and FIG. 6 simultaneously, an inspection and repair method of a flexible substrate is similar with the method shown as FIG. 2, a difference therebetween is that a sub-step S210d rather than the sub-step S210c is performed after the step S210b is completed. The sub-step S210d is an optical adjustment step, to perform a plasma treatment on the repair material layer 114, so as to form a repair layer 117. After the plasma treatment is performed, the formed repair layer 117 includes the polysilazane compound having the repeat unit shown as the Chemical Formula (1) below:

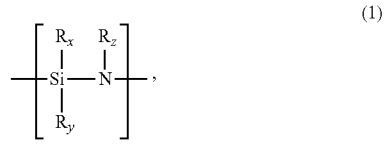

(1)

$R_x$, $R_y$ and $R_z$ are respectively hydrogen, a substituted $C_1$ to $C_{10}$ alkyl group, an unsubstituted alkyl group, an alkenyl group, or an aromatic group. The number-average molecular weight of the polysilazane compound is greater than $1 \times 10^6$. In some embodiments, the polysilazane compound is a macromolecule. In sub-step S210d, a bias voltage applied on the flexible substrate 100 is, for instance, between −5 KV and −20 KV, such that positive ions are injected into the repair material layer 114. The positive ions are, for instance, Ar ions. If the bias voltage applied on the flexible substrate 100 is greater than −5 KV, then the mechanism of the plasma treatment would be dominated by deposition or etching. The positive ions injected into the repair material layer 114 may suppress the reaction between the silazane compound and moisture in air to suppress the formation of Si—O bonds. Thus, the proportion of the Si—N bonds in the polysilazane compound of the formed repair layer 117 may be increased, so that a nitrogen fixation effect may be obtained. Accordingly, the nitrogen atom percentage in the repair layer 117 is larger than the nitrogen atom percentage in the repair material layer 114. In addition, the refractive index of the repair layer 117 is larger than the refractive index of the repair material layer 114 as well. Moreover, the higher the power of the plasma treatment, the higher the nitrogen atom percentage of the repair layer 117 is, and the higher the refractive index of the repair layer 117 is as well. As a result, the refractive index of the repair layer 117 may be controlled by adjusting the power of the plasma treatment. When the refractive index of the flexible substrate 100 is higher than the refractive index of the repair material layer 114, sub-step S210d may be performed to form the repair layer 117 with higher refractive index. Thus, the refractive index of the formed repair layer 117 approximates the refractive index of the flexible substrate 100, so that the difference between the overall effective refractive index of the flexible substrate 100 and the repair layer 117 and the refractive index of the flexible substrate 100 is, for instance, less than 0.1. Accordingly, the color difference between the repair layer 117 and the flexible substrate 100 may be effectively reduced.

Additionally, a hydrolysis reaction may be performed using moisture in the flexible substrate 100 and the polysilazane compound in the repair layer 117 adjacent to the flexible substrate 100, which results in dissipation of ammonia, such that Si—N bonds in the polysilazane compound are partly transformed into Si—O bonds. On the other hand, the other part of the repair layer 117 is subjected to the plasma treatment, such that the number of Si—N bonds thereof is relatively increased. Therefore, in the repair layer 117, the nitrogen atom percentage at a side adjacent to the flexible substrate 100 is less than the nitrogen atom percentage at another side away from the flexible substrate 100.

In addition, in some embodiments, step S212 shown in FIG. 2 may not be performed after sub-step S210d is performed.

Referring to both FIG. 1E (or FIG. 1D) and FIG. 5, a flexible substrate repair structure of the present embodiment is similar to the structure shown in FIG. 1E (or FIG. 1D), and the difference between the two is that the repair layer of the present embodiment is the repair layer 117 instead of the repair layer 116a (or the repair layer 116) shown in FIG. 1E (or FIG. 1D). In the repair layer 117 of the present embodiment, the nitrogen atom percentage at a side adjacent to the flexible substrate 100 is less than the nitrogen atom percentage at another side away from the flexible substrate 100. Moreover, the nitrogen atom percentage of the repair layer 117 of the present embodiment may be higher than the nitrogen atom percentage of the repair layer 116a (or the repair layer 116) shown in FIG. 1E (or FIG. 1D), and the refractive index of the repair layer 117 may be higher than the refractive index of the repair layer 116a (or the repair layer 116) as well.

In the above embodiments, the repair layer is a single layer. However, the repair layer of other embodiments of the disclosure may have double layers or more. A forming method of each of the repair layers may be a method according to the forming method of the repair layer 116, the repair layer 116a, or the repair layer 117. The methods and parameters applied in the optical adjustment step for each of the repair layers may be the same, or at least one of them is different from the others.

FIG. 7A to FIG. 7L are schematic cross-sectional views of a flexible substrate repair structure according to other embodiments of the disclosure. Referring to FIG. 7A through FIG. 7D, the repair layer may have double layers in the present embodiment.

In FIG. 7A through FIG. 7D, a forming method of the repair layer may be the forming method of the repair layer 116a shown in FIG. 1E. That is, sub-step S210a through sub-step S210c and step S212 are sequentially performed to form the repair layer 116a and a repair layer 216a. The forming method of the repair layer may further be the forming method of the repair layer 117 shown in FIG. 5. That is, sub-step S210a, sub-step S210b and sub-step S210d are sequentially performed to form the repair layer 117 or a repair layer 217. The parameters applied to form the repair layer 116a and the repair layer 216a may be the same or different. Similarly, the parameters applied to form the repair layer 117 and the repair layer 217 may be the same or different.

Based on the above embodiments, the nitrogen atom percentage of the repair layer 116a (or the repair layer 216a) is lower than the nitrogen atom percentage of the repair layer 117 (or the repair layer 217). Additionally, the refractive index of the repair layer 116a (or the repair layer 216a) is lower than the refractive index of the repair layer 117 (or the repair layer 217). In addition, in the method of forming the repair layer 116a (or the repair layer 216a), the higher the temperature of the heat treatment or the post-treatment, the lower the nitrogen atom percentage in the repair layer 116a (or the repair layer 216a) is, and the lower the refractive index of the repair layer 116a (or the repair layer 216a) is as well. Furthermore, in the forming method the repair layer 117 (or the repair layer 217), the higher the power of the plasma treatment, the higher the nitrogen atom percentage in the repair layer 117 (or the repair layer 217) is, and the higher the refractive index of the repair layer 117 (or the repair layer 217) is as well.

As a result, by stacking the repair layer 116a and the repair layer 217 or stacking the repair layer 117 and the repair layer 216a, the variation of refractive index of the flexible substrate 100 and the two repair layers along the normal direction of the flexible substrate 100 may be alternately high and low to enhance the overall transmittance of the flexible substrate 100 and the two repair layers in a certain wavelength range (e.g., the wavelength range of visible light). In addition, by stacking the repair layer 116a and the repair layer 216a with different heat treatment temperatures or stacking the repair layer 117 and the repair layer 217 with different plasma treatment powers, the variation of refractive index of the flexible substrate 100 and the two repair layers along the normal direction of the flexible substrate 100 is alternately high and low to enhance the overall transmittance of the flexible substrate 100 and the two repair layers in a certain wavelength range (e.g., the wavelength range of visible light).

In some embodiments, the repair layer 16a and the repair layer 216a may further be replaced by the repair layer 116 shown in FIG. 1D. That is, sub-step S210a through sub-step S210c shown in FIG. 2 are sequentially performed, while step S212 is omitted. As a result, a repair layer having double layers may be formed by the repair layer 116 and the repair layer 117 (or the repair layer 217), or may be formed by the repair layers 116 with the same heat treatment parameters or with different heat treatment parameters.

Referring to FIG. 7E through FIG. 7L, in the present embodiment, the number of the repair layer is three. The forming method of each of the repair layers may be the forming method of the repair layer 116a shown in FIG. 1E, in order to form the repair layer 116a, the repair layer 216a, or a repair layer 316a. The forming method of each of the repair layer may also be the forming method of the repair layer 117 shown in FIG. 5, in order to form the repair layer 117, the repair layer 217, or a repair layer 317. Accordingly, the repair layer having three layers may be formed by stacking the repair layer 116a (the repair layer 216a or the repair layer 316a) and the repair layer 117 (the repair layer 217 or the repair layer 317). In particular, parameters of forming the repair layer 116a, the repair layer 216a, and the repair layer 316a shown in FIG. 7E through FIG. 7L are the same or different. Similarly, the parameters of forming the repair layer 117, the repair layer 217, and the repair layer 317 are the same or different.

Similarly to the embodiments shown in FIG. 7A through FIG. 7D, by alternately stacking one of the repair layer 116a, the repair layer 216a, and the repair layer 316a and one of the repair layer 117, the repair layer 217, and the repair layer 317, the flexible substrate 100 and the three repair layers with an alternately high and low variation of refractive index along the normal direction of the flexible substrate 100 may be formed to enhance the overall transmittance of the flexible substrate 100 and the three repair layers in a certain wavelength range (e.g., the wavelength range of visible light). In addition, by stacking the repair layer 116a, the repair layer 216a, and the repair layer 316a with different heat treatment temperatures or stacking the repair layer 117, the repair layer 217, and the repair layer 317 with different plasma treatment powers, the flexible substrate 100 and the three repair layers with an alternately high and low variation of refractive index along the normal direction of the flexible substrate 100 may be formed to enhance an overall transmittance of the flexible substrate 100 and the three repair layers in a certain wavelength range (e.g., the wavelength range of visible light).

In some embodiments, the repair layer 116a, the repair layer 216a, and the repair layer 316a may further be replaced by the repair layer 116 shown in FIG. 1D. That is, sub-step S210a through sub-step S210c shown in FIG. 2 may be sequentially performed, while the step S212 is omitted. Thus, the repair layer having three layers may be formed by the repair layer 116 and the repair layer 117, the repair layer 217, or the repair layer 317, or may be formed by the repair layers 116 with the same heat treatment parameters or different heat treatment parameters.

When the refractive index of the flexible substrate 100 is greater than or equal to the refractive index of the repair layer 117, the stacking manner of the three repair layers may be the repair layer 117 interposed between two repair layers 116a (or two repair layers 116) to enhance the overall transmittance of the flexible substrate 100 and the three repair layers in a certain wavelength range (e.g., the wavelength range of visible light). On the other hand, when the refractive index of the flexible substrate 100 is less than the refractive index of the repair layer 116a (or the repair layer 116), the stacking manner of the three repair layers may be the repair layer 116a (or the repair layer 116) disposed between two repair layers 117. Moreover, in other embodiments, the number of the repair layers may be greater than three, and the disclosure is not limited to the number of the repair layers.

In view of above, in the flexible substrate repair structure of an embodiment of the disclosure, the repair layer is completely filled in the recess of the flexible substrate. Accordingly, forming of a void in the flexible substrate can be avoided, such that the problem of cracking or breaking of a layer formed on the flexible substrate in a subsequent process can be avoided. In addition, the adhesion between the flexible substrate and the polysilazane compound of the repair layer is good, so that the problem of delamination between the flexible substrate and the repair layer can be avoided. Moreover, the polysilazane compound of the repair layer can further prevent moisture and oxygen in the air from penetrating the flexible substrate and entering an electronic device subsequently formed on the flexible substrate.

Furthermore, the manufacturing method of a flexible substrate repair structure according to an embodiment of the disclosure includes performing an optical adjustment step to change the refractive index of the repair layer. Thus, a difference between the overall effective refractive index of the flexible substrate and the repair layer and the refractive index of the flexible substrate is reduced. As a result, the color difference between the repair layer and the flexible substrate may be effectively reduced.

Additionally, an inspection and repair method of a flexible substrate according to an embodiment of the disclosure includes categorizing the defect based on the type and the location of the defect, and repairing the flexible substrate having the defect. Accordingly, a subsequent process can be performed on a part of the flexible substrate having the defect after the repair. In other words, the number of the flexible substrate determined as waste may be reduced to lower manufacturing cost.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A flexible substrate repair structure, comprising:
a flexible substrate having a regular recess; and
at least one repair layer located on the flexible substrate and completely filled in the regular recess,
wherein a material of the at least one repair layer is a polysilazane compound comprising a polysilazane compound having a unit shown in formula (1) below,

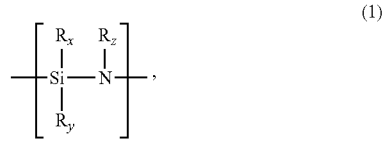

wherein $R_x$, $R_y$ and $R_z$ are respectively hydrogen, a substituted $C_1$ to $C_{10}$ alkyl group, an unsubstituted alkyl group, an alkenyl group, or an aromatic group.

2. The flexible substrate repair structure according to claim 1, wherein the regular recess is a recess having a smooth contour.

3. The flexible substrate repair structure according to claim 2, wherein a shape of an opening of the regular recess comprises a circular shape, an oval shape, a rectangular shape, or a polygonal shape.

4. The flexible substrate repair structure according to claim 1, wherein in the repair layer in contact with the flexible substrate, a nitrogen atom percentage at a side adjacent to the flexible substrate is less than a nitrogen atom percentage at another side away from the flexible substrate.

5. The flexible substrate repair structure according to claim 1, wherein the at least one repair layer is a plurality of repair layers.

6. The flexible substrate repair structure according to claim 5, wherein a variation of a nitrogen atom percentage of the plurality of repair layers in a normal direction of the flexible substrate is alternately high and low.

7. A manufacturing method of a flexible substrate repair structure, comprising:
coating a repair solution on a flexible substrate, wherein a capillary index of the repair solution is less than $10^{-5}$;
removing a solvent in the repair solution to form at least one repair material layer; and
performing an optical adjustment step to change a refractive index of the at least one repair material layer to form the at least one repair layer.

8. The manufacturing method of a flexible substrate repair structure according to claim 7, wherein a solute of the repair solution comprises a silazane compound having a unit shown in formula (1) below,

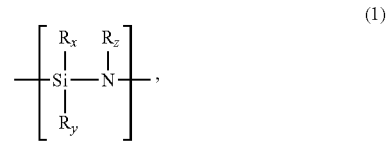

wherein $R_x$, $R_y$ and $R_z$ are respectively a hydrogen atom, a substituted $C_1$ to $C_{10}$ alkyl group, an unsubstituted alkyl group, an alkenyl group, or an aromatic group.

9. The manufacturing method of a flexible substrate repair structure according to claim 8, wherein the optical adjustment step comprises adjusting a nitrogen atom percentage in the at least one repair material layer.

10. The manufacturing method of a flexible substrate repair structure according to claim 7, wherein the optical adjustment step comprises performing a heat treatment on the at least one repair material layer to reduce the nitrogen atom percentage of the at least one repair material layer.

11. The manufacturing method of a flexible substrate repair structure according to claim 10, further comprising performing a post-treatment on the at least one repair layer after the heat treatment is performed to lower a nitrogen atom percentage of the at least one repair layer.

12. The manufacturing method of a flexible substrate repair structure according to claim 7, wherein the optical adjustment step comprises performing a plasma treatment on the at least one repair material layer to increase the nitrogen atom percentage of the at least one repair material layer.

13. The manufacturing method of a flexible substrate repair structure according to claim 7, wherein forming the at least one repair layer on the flexible substrate comprises forming a plurality of repair layers on the flexible substrate.

14. The manufacturing method of a flexible substrate repair structure according to claim 13, wherein methods and parameters used in the optical adjustment step to form every one of the repair layers are the same.

15. The manufacturing method of a flexible substrate repair structure according to claim 13, wherein at least one of methods and parameters used in the optical adjustment step to form every one of the repair layers is different.

16. The manufacturing method of a flexible substrate repair structure according to claim 13, wherein a variation of a nitrogen atom percentage of the plurality of repair layers in a normal direction of the flexible substrate surface is made alternately high and low by the optical adjustment step.

17. The manufacturing method of a flexible substrate repair structure according to claim 7, further comprising performing a removing step before the at least one repair layer is formed to remove a defect located on the flexible substrate and/or in the flexible substrate.

18. The manufacturing method of a flexible substrate repair structure according to claim 17, wherein the removing step comprises performing pulse laser etching or polishing a surface of the flexible substrate.

19. The manufacturing method of a flexible substrate repair structure according to claim 7, further comprising performing a hydrophilic treatment on the flexible substrate before the at least one repair layer is formed.

20. An inspection and repair method of a flexible substrate, comprising:

inspecting a flexible substrate to determine whether the flexible substrate has a defect;
categorizing the inspected defect according to a type or a location of the defect if an inspection result shows the flexible substrate has the defect; and
performing the manufacturing method of a flexible substrate repair structure according to claim 7.

\* \* \* \* \*